United States Patent
Yu et al.

(10) Patent No.: US 11,106,253 B2
(45) Date of Patent: Aug. 31, 2021

(54) ELECTRONIC DEVICE AND FRAME MODULE THEREOF

(71) Applicant: Wistron Corp., New Taipei (TW)

(72) Inventors: Zhi-Tao Yu, New Taipei (TW);
Hai-Nan Qiu, New Taipei (TW);
Yu-Jian Wu, New Taipei (TW);
Bo-Chun Lin, New Taipei (TW);
Chia-Hsin Liu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/849,920

(22) Filed: Apr. 15, 2020

(65) Prior Publication Data
US 2021/0116978 A1    Apr. 22, 2021

(30) Foreign Application Priority Data

Oct. 21, 2019    (CN) .......................... 201911001086.9

(51) Int. Cl.
| H05K 7/14 | (2006.01) |
| H05K 7/18 | (2006.01) |
| G06F 1/18 | (2006.01) |
| H05K 7/20 | (2006.01) |

(52) U.S. Cl.
CPC ........... *G06F 1/186* (2013.01); *H05K 7/1405* (2013.01); *H05K 7/1418* (2013.01); *H05K 7/1461* (2013.01); *H05K 7/20172* (2013.01)

(58) Field of Classification Search
USPC ........................................................ 361/801
See application file for complete search history.

(56) References Cited

U.S. PATENT DOCUMENTS

| 5,717,571 A * | 2/1998 | Helot .................... G06F 1/1616 361/679.57 |
| 6,138,839 A * | 10/2000 | Cranston, III .......... G06F 1/184 211/41.17 |
| 6,480,392 B1 * | 11/2002 | Jiang ....................... G06F 1/184 312/223.2 |
| 7,510,796 B2 * | 3/2009 | Tokano ............... H01M 50/147 429/96 |
| 8,562,036 B2 * | 10/2013 | Zhou ................... H01M 50/209 292/256 |

FOREIGN PATENT DOCUMENTS

| CN | 203930631 U | 11/2014 |
| CN | 108646897 A | 10/2018 |
| TW | 527064 U | 4/2003 |
| TW | M366270 U1 | 10/2009 |

* cited by examiner

*Primary Examiner* — Hung S. Bui

(57) ABSTRACT

A frame module is provided, which is adapted to connect to an object unit. The frame module includes a module housing, a latch, and a cover. The object unit is connected to the module housing. The latch is connected to the module housing, which is adapted to be moved between the first latch position and the second latch position. When the latch is in the first latch position, the latch is connected to the object unit to restrict the object unit. When the latch is in the second latch position, the latch is separated from the object unit. The cover pivots on the module housing, which is adapted to be rotated between the first cover orientation and the second cover orientation. When the cover is in the first cover orientation, the cover presses the latch and keeps the latch in the first latch position.

20 Claims, 21 Drawing Sheets

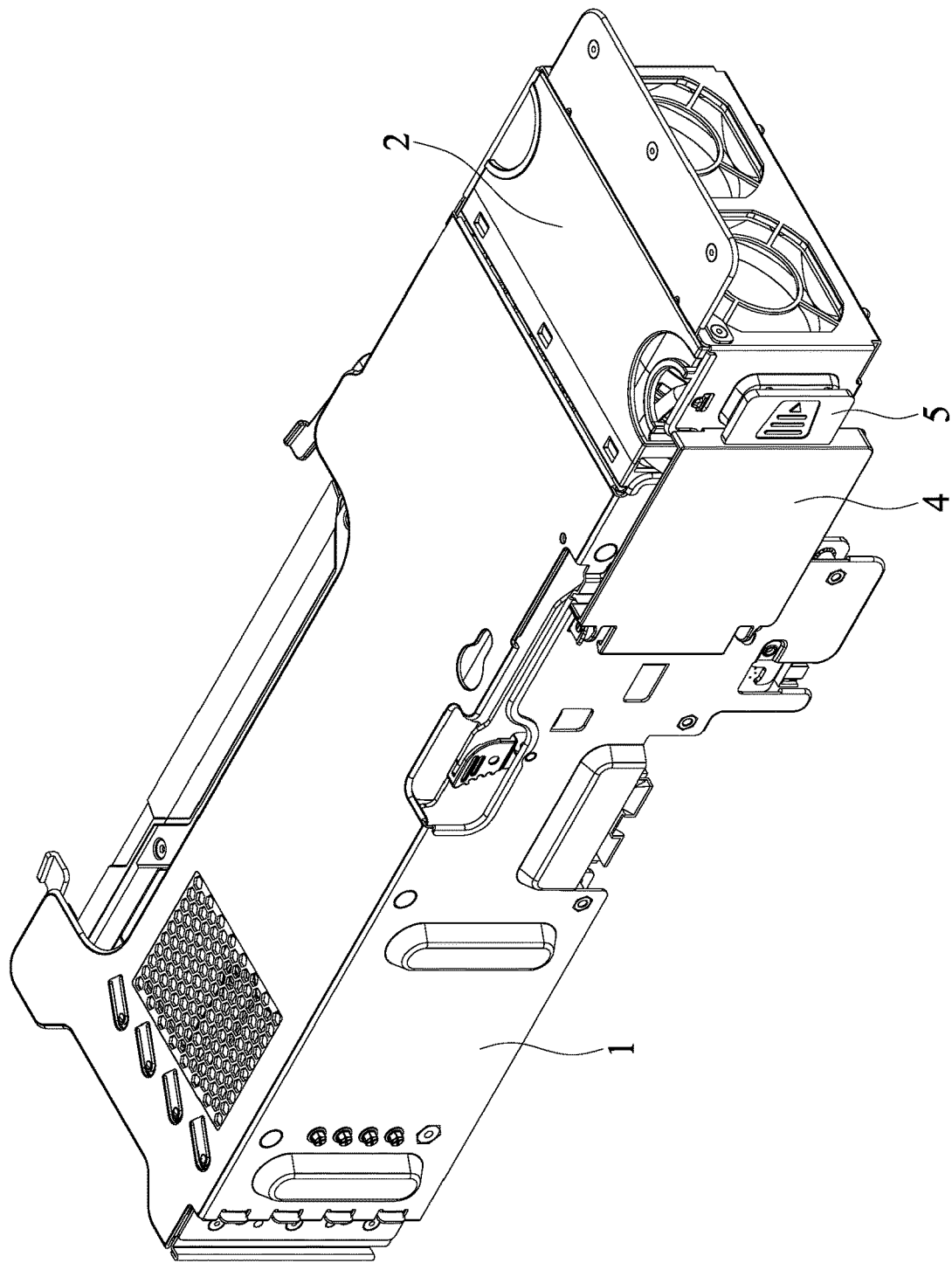

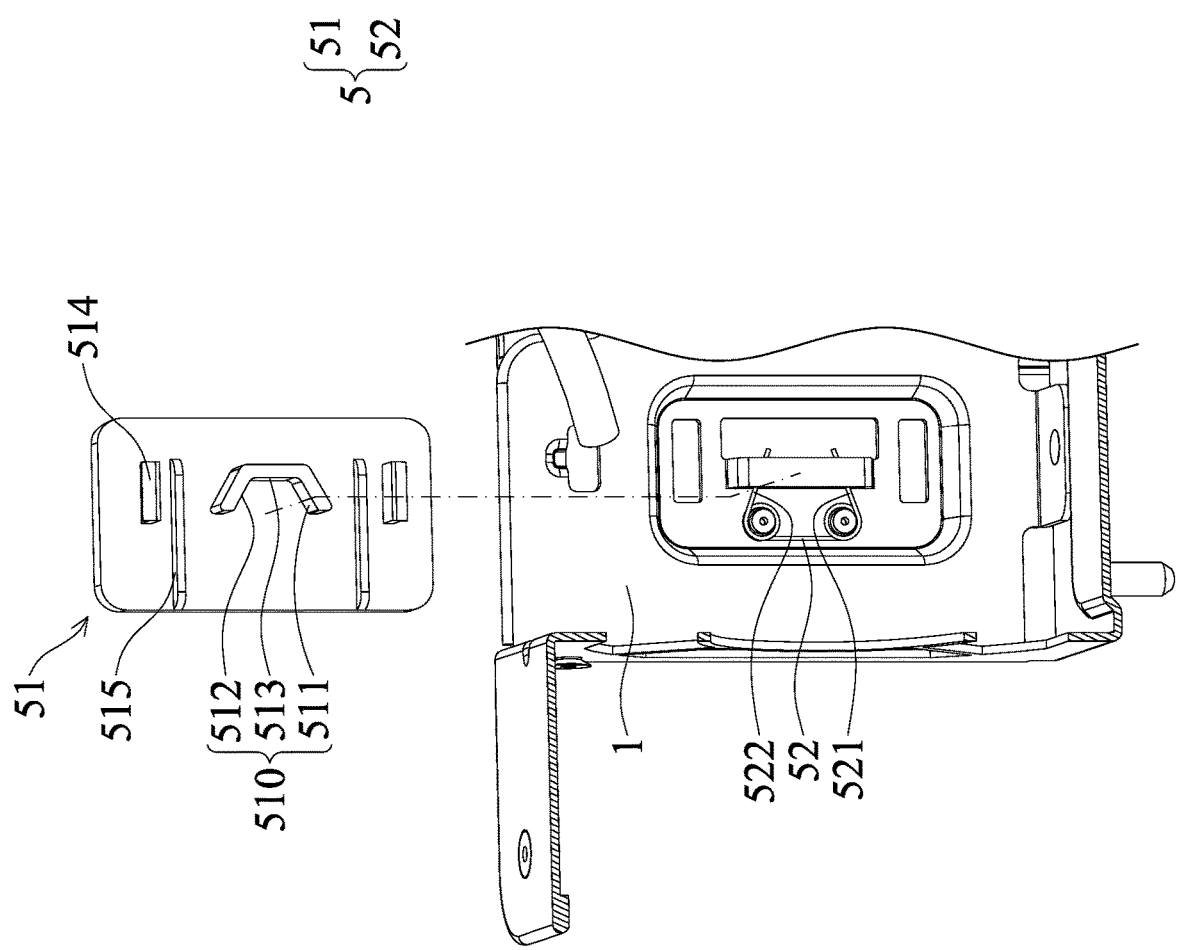

ELECTRONIC DEVICE AND FRAME MODULE THEREOF

CROSS REFERENCE TO RELATED APPLICATIONS

This application claims priority of China Patent Application No. 201911001086.9, filed on Oct. 21, 2019, the entirety of which is incorporated by reference herein.

BACKGROUND OF THE INVENTION

Field of the Invention

The present invention relates to an electronic device, and in particular to an electronic device with a protection-designed frame module.

Description of the Related Art

The conventional graphics processing module of a server includes a module housing, graphics processing interface cards, a fan unit and a riser card. The graphics processing interface cards are connected to the riser card. The fan unit is connected to the riser card via a connection line. Conventionally, the connection line of the fan unit extends under the module housing. The connection line is connected to a connector of the riser card, and the connection line therefore connects the fan unit to the riser card. When the maintainer wants to detach the fan unit, the existence of the connection line is omitted carelessly by the maintainer, and the maintainer may pull the fan unit vigorously. The connection line or the connector of the riser card is therefore damaged.

BRIEF SUMMARY OF THE INVENTION

In one embodiment, a frame module is provided. The frame module is adapted to connect to an object unit. The frame module includes a module housing, a latch, and a cover. The object unit is connected to the module housing. The latch is connected to the module housing. The latch is adapted to be moved between the first latch position and the second latch position. When the latch is in the first latch position, the latch is connected to the object unit to restrict the object unit, and when the latch is in the second latch position, the latch is separated from the object unit. The cover pivots on the module housing. The cover is adapted to be rotated between the first cover orientation and the second cover orientation. When the cover is in the first cover orientation, the cover presses the latch and keeps the latch in the first latch position, and when the cover leaves the first cover orientation, the latch is not pressed by the cover, and the latch is returned to the second latch position.

In another embodiment, an electronic device is provided. The electronic device includes a device housing, an object unit and a frame module. The frame module is disposed in the device housing. The frame module includes a module housing, a latch, and a cover. The object unit is connected to the module housing. The latch is connected to the module housing. The latch is adapted to be moved between the first latch position and the second latch position. When the latch is in the first latch position, the latch is connected to the object unit to restrict the object unit, and when the latch is in the second latch position, the latch is separated from the object unit. The cover pivots on the module housing. The cover is adapted to be rotated between the first cover orientation and the second cover orientation. When the cover is in the first cover orientation, the cover presses the latch and keeps the latch in the first latch position, and when the cover leaves the first cover orientation, the latch is not pressed by the cover, and the latch is returned to the second latch position.

Utilizing the frame module of the embodiment of the invention, when the maintainer wants to detach the fan unit (object unit), the maintainer must open the cover and remove the latch from the fan unit (object unit), and the fan unit (object unit) therefore can be detached. After opening the cover, the maintainer will be aware of the connection line. The maintainer will thus disconnect the connection line from the riser card before detaching the fan unit (object unit). The riser card can be prevented from being damaged, and the reliability and the lifespan of the electronic device can be increased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3A is a perspective view of the frame module of the embodiment of the invention, wherein the cover is in the first cover orientation;

FIGS. 6A, 6B and 6C show the details of a locking unit of the embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
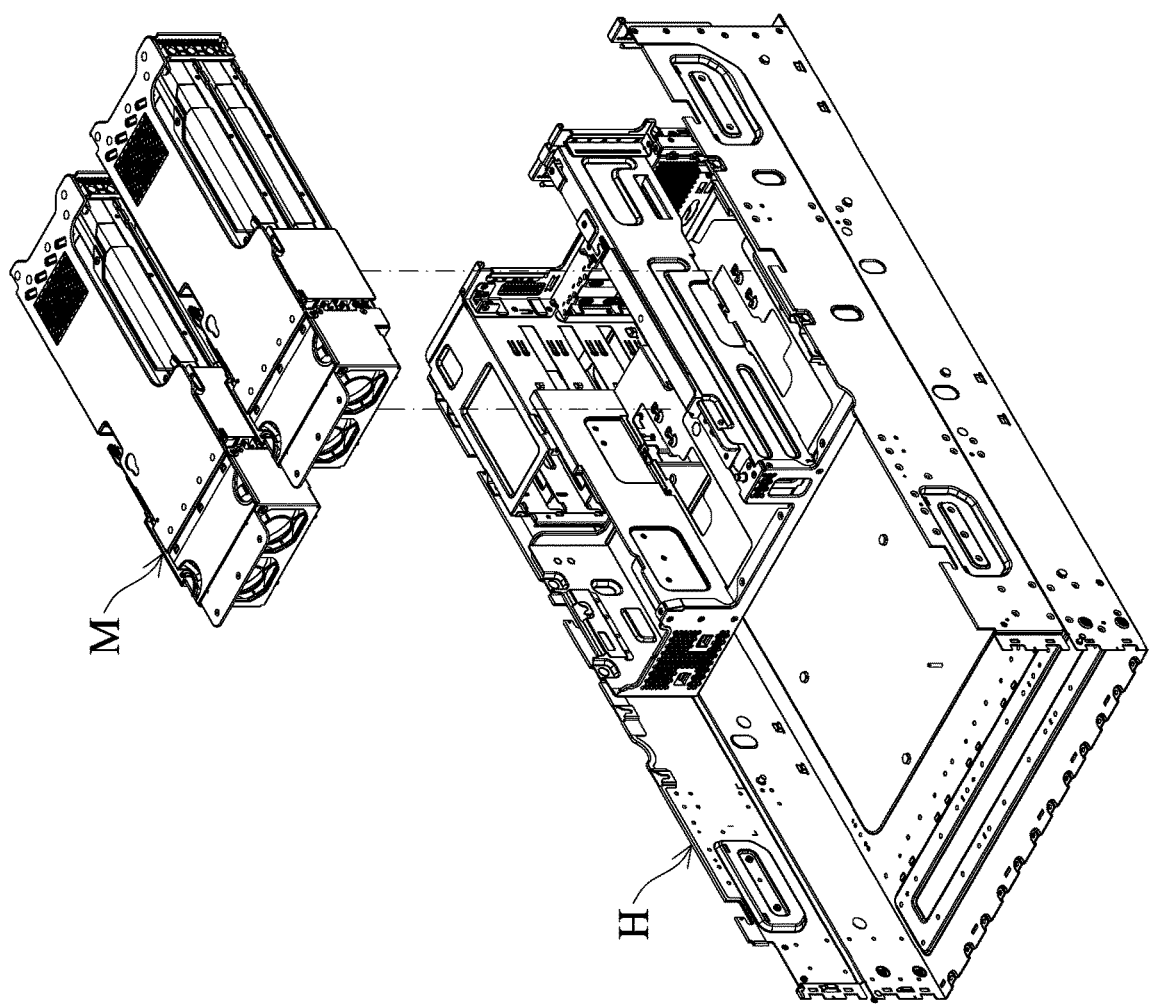
FIG. 1 shows an electronic device of an embodiment of the invention.

FIG. 1 shows an electronic device E of an embodiment of the invention. With reference to FIG. 1, the electronic device E of the embodiment of the invention includes a device housing H and a frame module M. The frame module M is detachably disposed in the device housing H. Electronic elements such as hard disk, processer or graphics processing unit can be disposed in the frame module M. In a server, the electronic elements can be connected to the device housing H via the frame module M.

Figure 2:
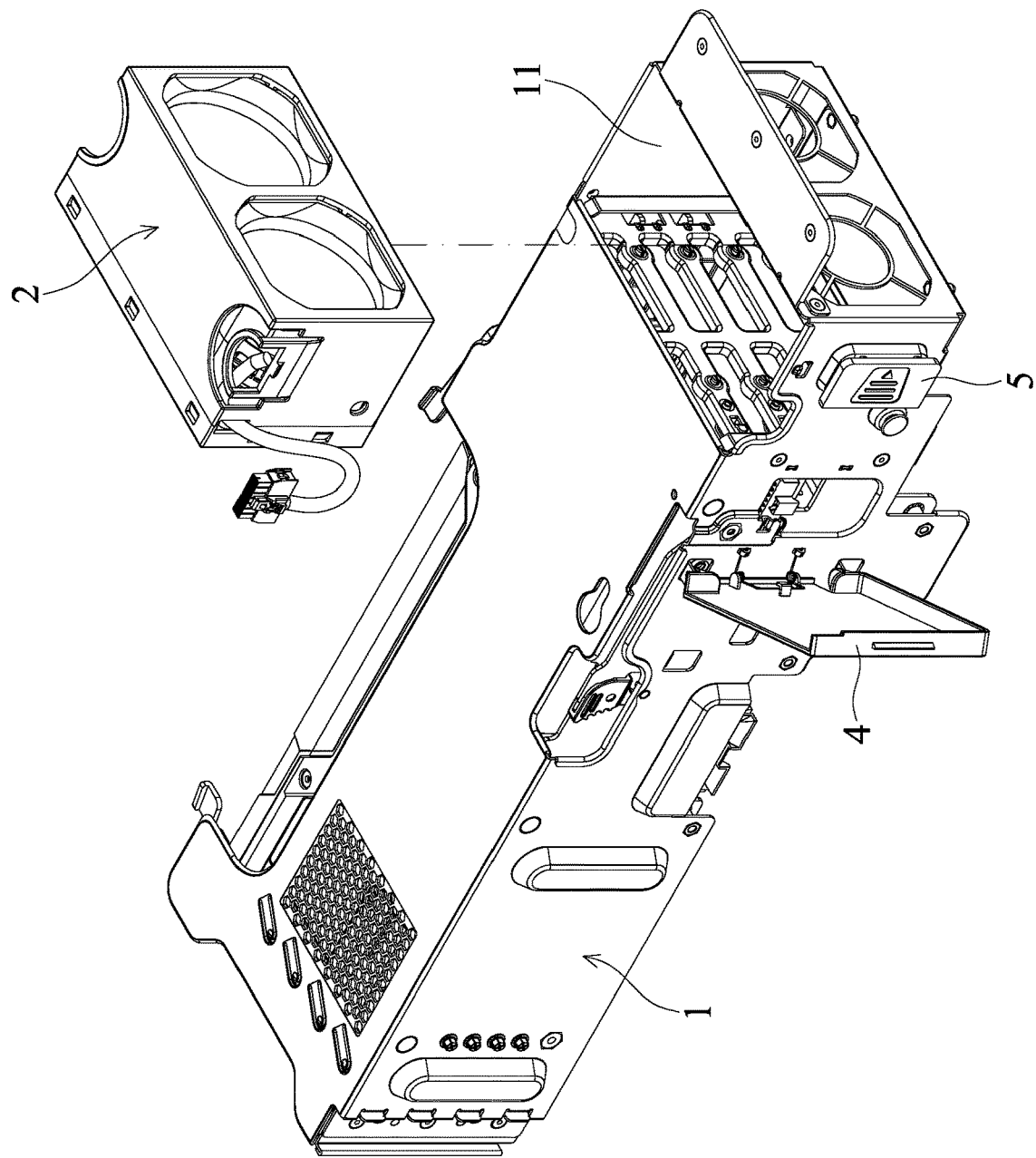
FIG. 2 is an exploded view of a fan unit and a frame module of the embodiment of the invention.
Figure 3B:
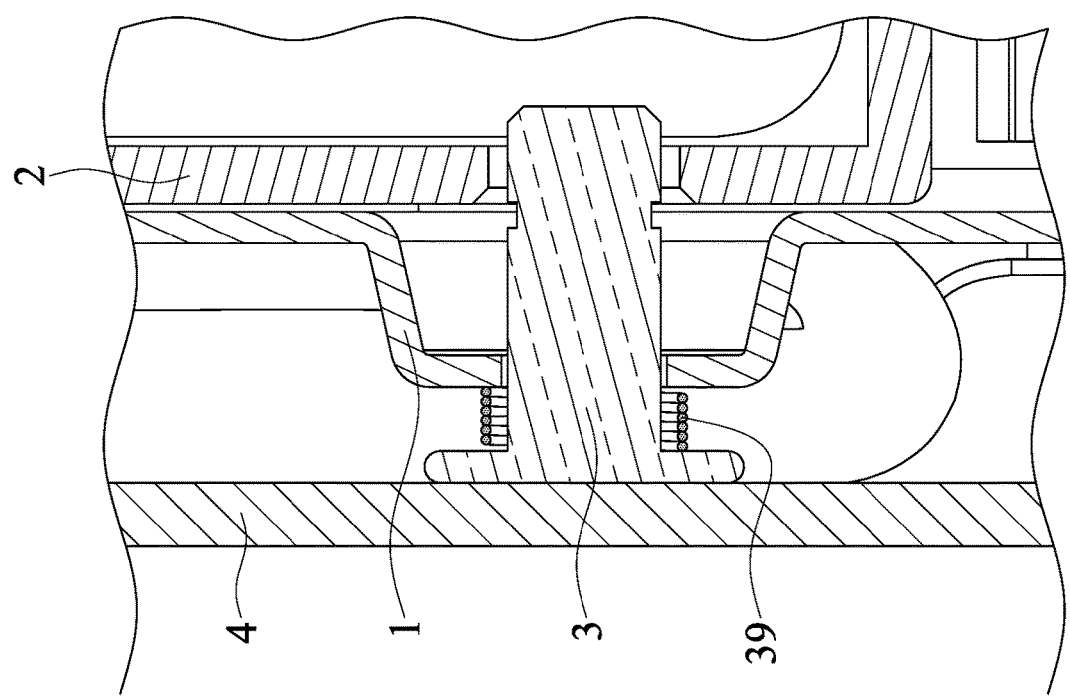
FIG. 3B is a sectional view of the frame module of the embodiment of the invention, wherein the cover is in the first cover orientation and a latch is in the first latch position.
Figure 4A:
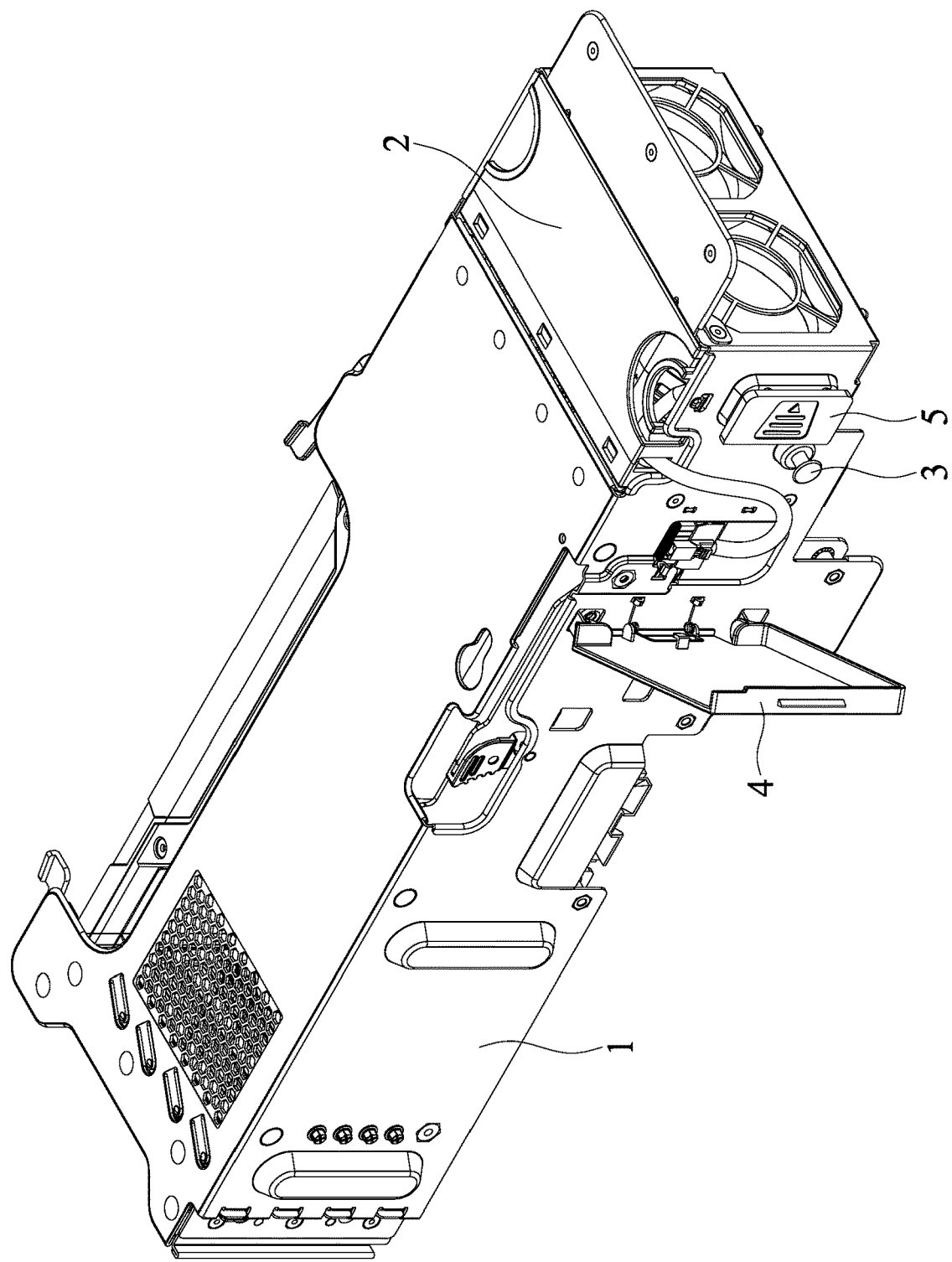
FIG. 4A is a perspective view of the frame module of the embodiment of the invention, wherein the cover is in the second cover orientation.
Figure 4B:
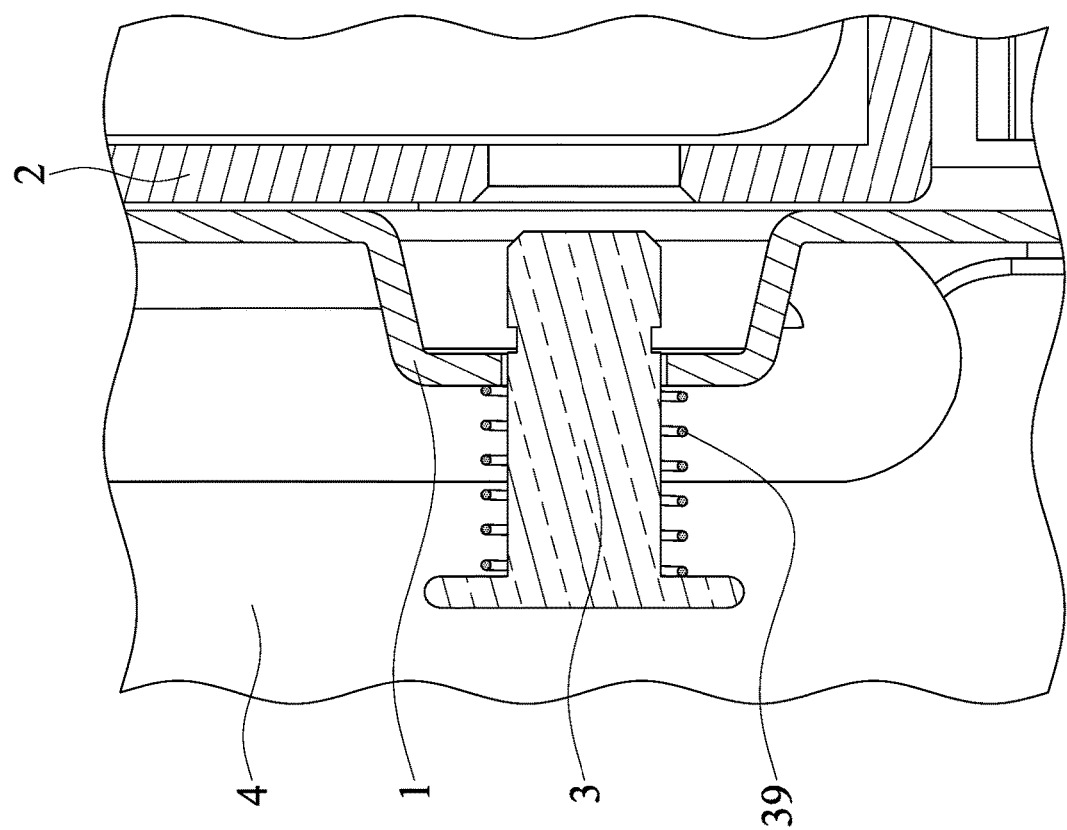
FIG. 4B is a sectional view of the frame module of the embodiment of the invention, wherein the cover is in the second cover orientation and the latch is in the second latch position.

FIG. 2 is an exploded view of a fan unit and the frame module of the embodiment of the invention. FIG. 3A is a perspective view of the frame module of the embodiment of the invention, wherein a cover is in a first cover orientation. FIG. 3B is a sectional view of the frame module of the embodiment of the invention, wherein the cover is in the first cover orientation and a latch is in a first latch position. FIG. 4A is a perspective view of the frame module of the embodiment of the invention, wherein the cover is in a second cover orientation. FIG. 4B is a sectional view of the frame module of the embodiment of the invention, wherein the cover is in the second cover orientation and the latch is in a second latch position. With reference to FIGS. 2, 3A, 3B, 4A and 4B, the frame module M includes a module housing 1, a latch 3 and a cover 4. A fan unit (object unit) 2 is detachably connected to the module housing 1. The latch 3 is connected to the module housing 1. The latch 3 is adapted to be moved between a first latch position (FIG. 3B) and a second latch position (FIG. 4B). When the latch 3 is in the first latch position, the latch 3 is connected to the fan unit 2 to restrict the fan unit 2. When the latch 3 is in the second latch position, the latch 3 is separated from the fan unit 2. The cover 4 pivots on the module housing 1. The cover 4 is adapted to be rotated between a first cover orientation (FIG. 3A) and a second cover orientation (FIG. 4A). When the cover 4 is in the first cover orientation, the cover 4 presses and pushes the latch 3 and keeps the latch 3 in the first latch position (FIG. 3B). When the cover 4 leaves the first cover orientation, the latch 3 is not pressed (or pushed) by the cover 4, and the latch 3 is returned to the second latch position (FIG. 4B).

With reference to FIGS. 3A and 4A, in one embodiment, the frame module M further comprises a locking unit 5. The locking unit 5 is disposed on the module housing 1. When the cover 4 is in the first cover orientation (FIG. 3A), the cover 4 is wedged into the locking unit 5. When the cover 4 is in the second cover orientation (FIG. 4A), the cover 4 is separated from the locking unit 5.

With reference to FIGS. 3B and 4B, in one embodiment, the frame module M further comprises a latch elastic element 39. One end of the latch elastic element 39 abuts the latch 3. The other end of the latch elastic element 39 abuts the module housing 1. When the latch 3 is in the first latch position (FIG. 3B), the latch elastic element 39 exerts a first elastic force on the latch 3, and the latch 3 is therefore tend to be moved toward the second latch position (FIG. 4B).

Figure 5A:
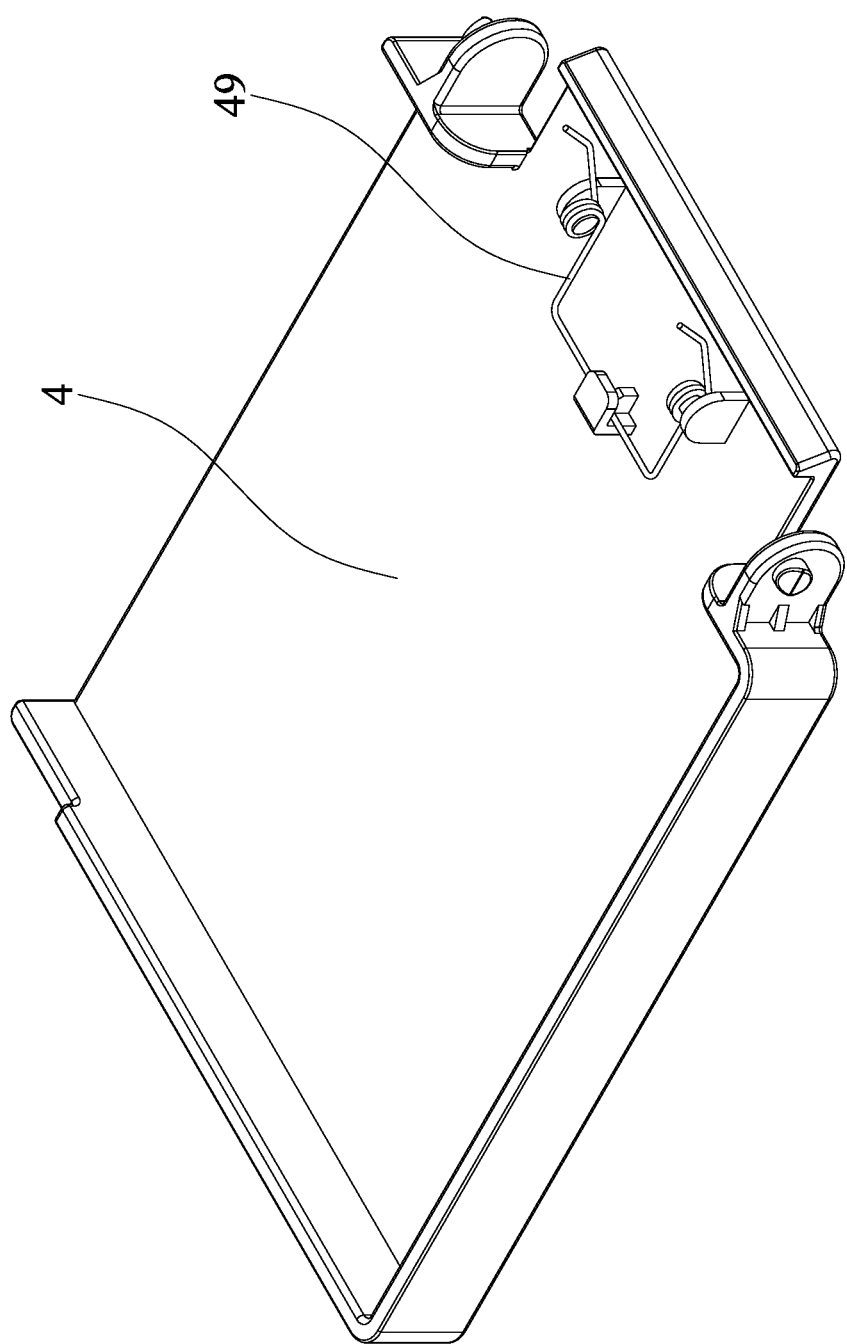
FIGS. 5A and 5B show the details of a cover elastic element of the embodiment of the invention.
Figure 5B:
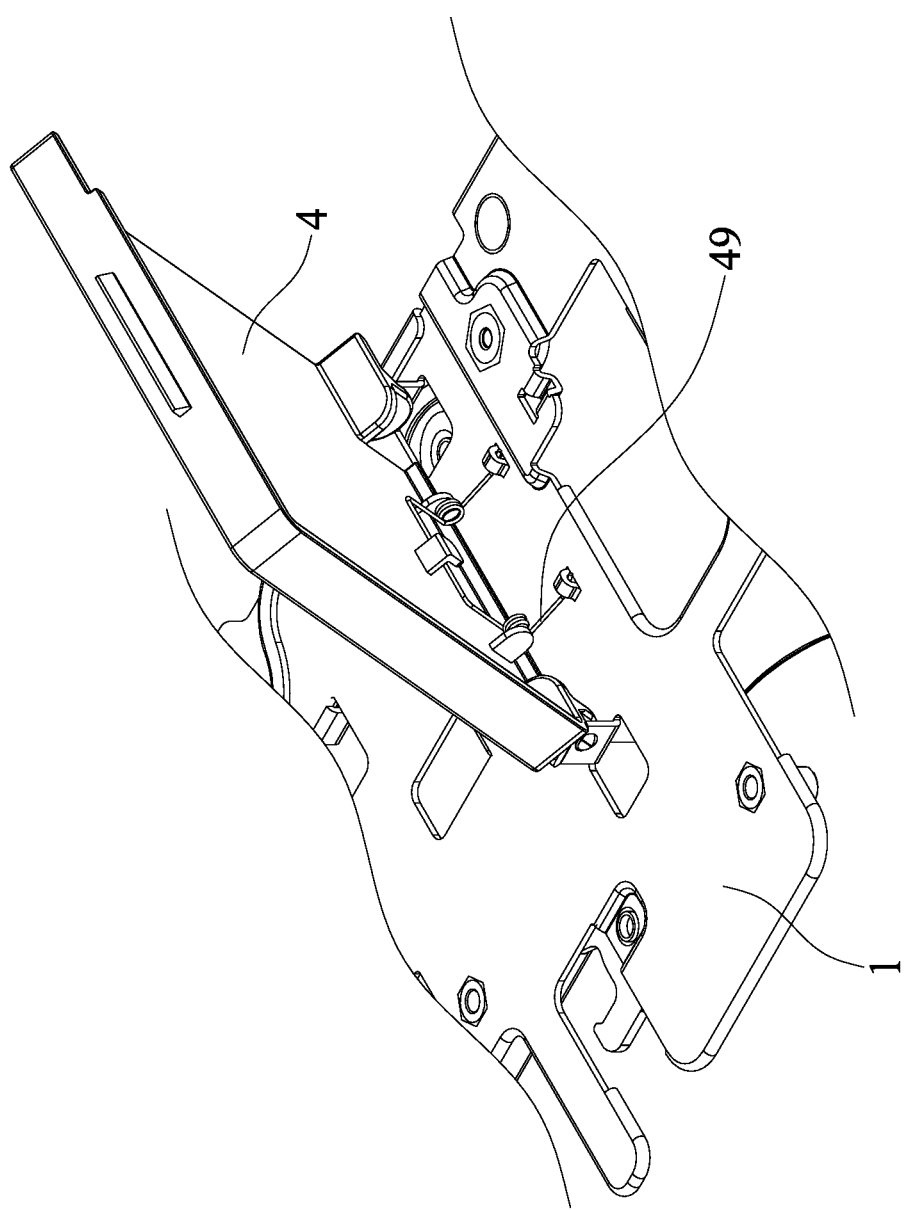

FIGS. 5A and 5B show the details of a cover elastic element of the embodiment of the invention. With reference to FIGS. 3A, 4A, 5A and 5B, in one embodiment, the frame module M further comprises a cover elastic element 49. The cover elastic element 49 abuts the cover 4 and the module housing 1. When the cover 4 is in the first cover orientation (FIG. 3A), the cover elastic element 49 exerts a second elastic force on the cover 4, and the cover 4 is therefore tend to be moved toward the second cover orientation (FIG. 4A).

In this embodiment, the cover elastic element 49 is substantially U-shaped. The two ends of the cover elastic element 49 are connected to the module housing 1, and the cover elastic element 49 is partially embedded to the cover 4.

Figure 5C:
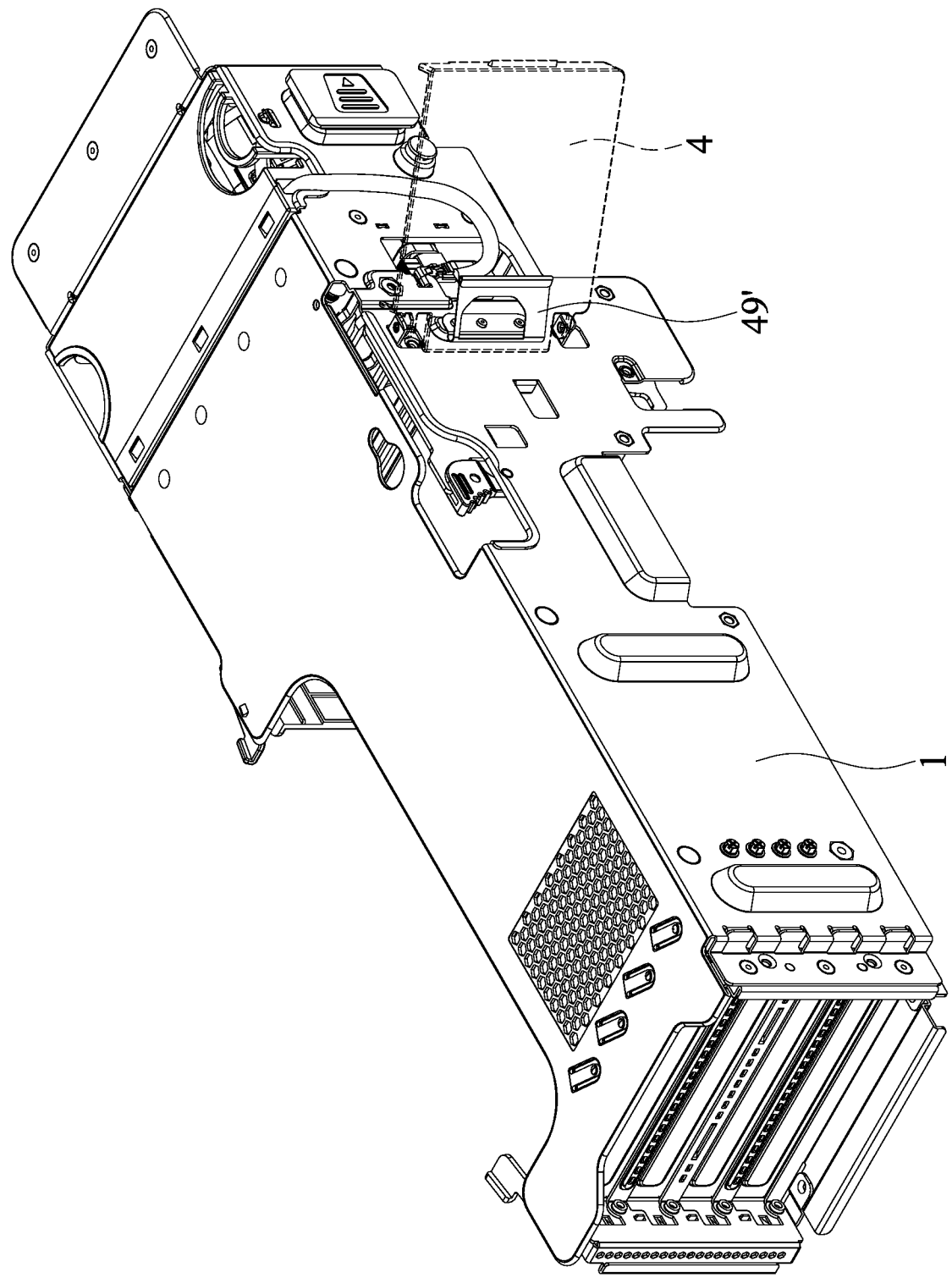
FIG. 5C shows a cover elastic element of another embodiment of the invention.

FIG. 5C shows a cover elastic element of another embodiment of the invention. With reference to FIG. 5C, the cover elastic element 49' abuts the cover 4 and the module housing 1. When the cover 4 is in the first cover orientation, the cover elastic element 49' exerts a second elastic force on the cover 4, and the cover 4 is therefore tend to be moved toward the second cover orientation. In this embodiment, the cover elastic element 49' is substantially L-shaped, such as a leaf spring. In the embodiment of the invention, the design of the cover elastic element can be modified. The disclosure is not meant to restrict the invention.

Figure 6A:
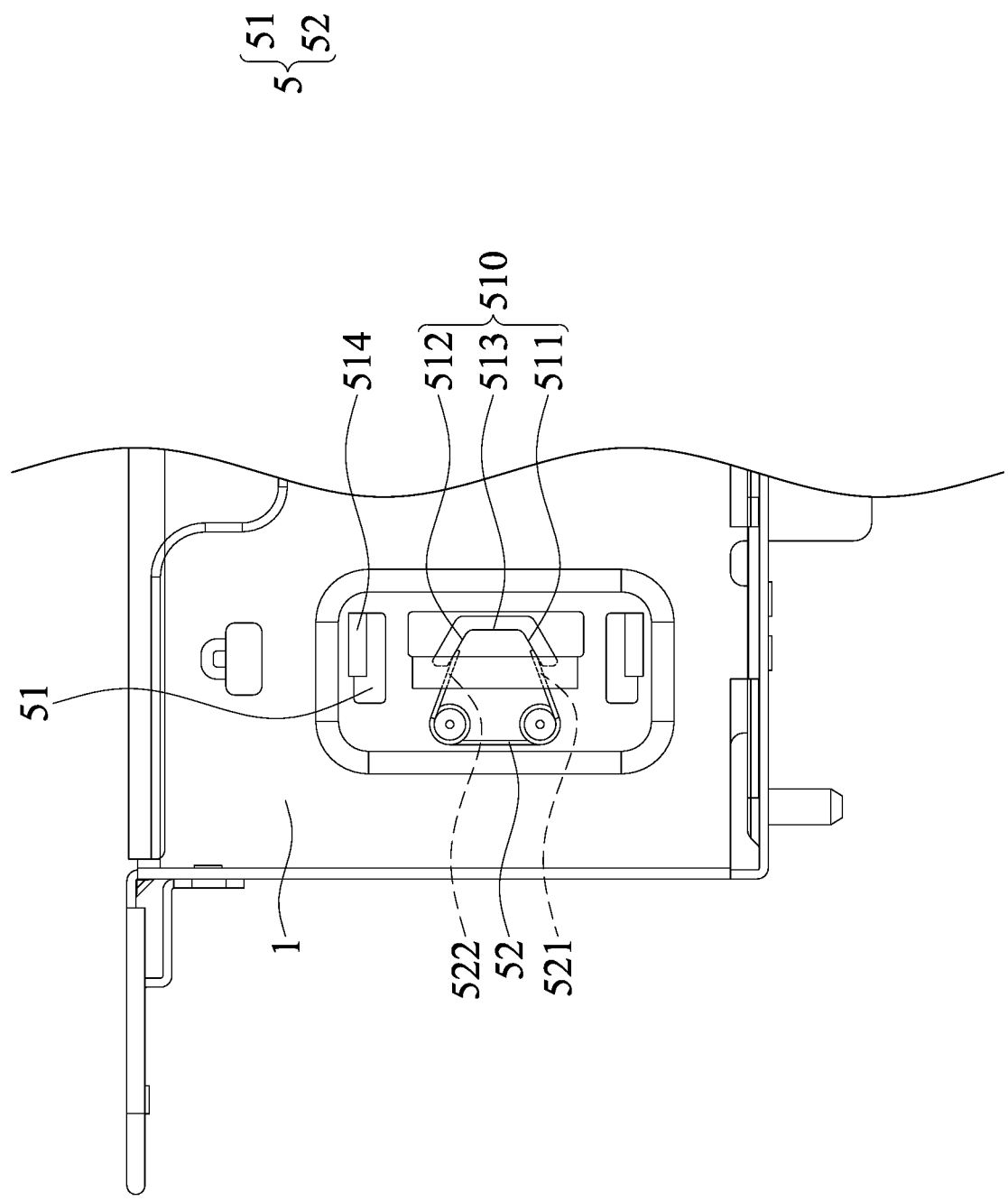
Figure 6B:
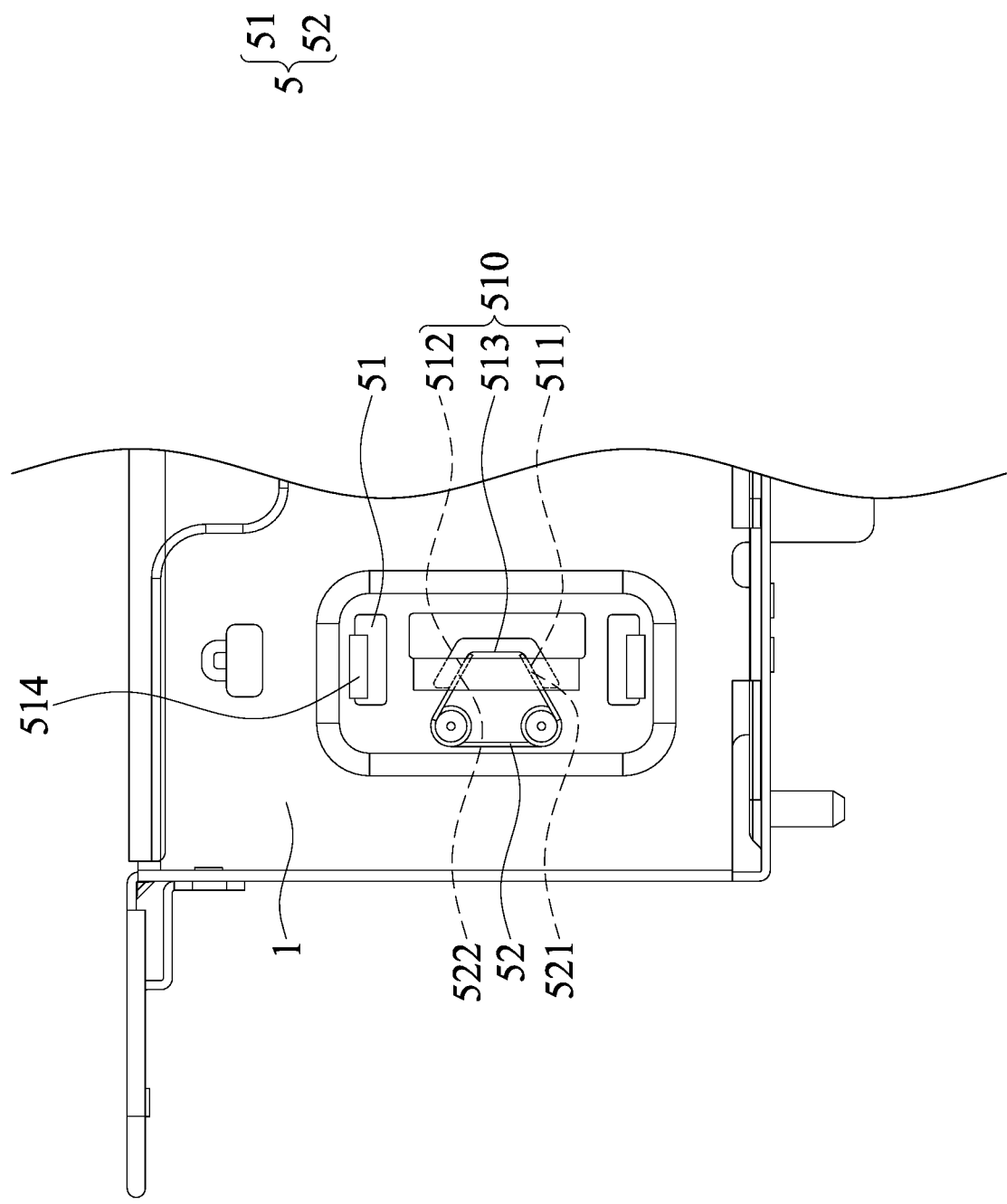

FIGS. 6A, 6B and 6C show the details of a locking unit of the embodiment of the invention. With reference to FIGS. 6A, 6B and 6C, in one embodiment, the locking unit 5 comprises a slider 51 and a slider elastic element 52. The slider 51 is slidably connected to the module housing 1. The slider elastic element 52 is disposed between the slider 51 and the module housing 1. The slider 51 is adapted to be moved between a first slider position and a second slider position. When the slider 51 is in the first slider position (FIG. 6A), the slider 51 is adapted to be wedged into the cover 4 (with reference to FIG. 3A). When the slider 51 is in the second slider position (FIG. 6B), the slider 51 is tend to release the cover 4 (with reference to FIG. 4A).

With reference to FIGS. 6A, 6B and 6C, in one embodiment, the slider 51 comprises a groove 510. The groove 510 comprises a first wall 511, a second wall 512 and a bottom wall 513. The first wall 511 and the second wall 512 are connected to the bottom wall 513. The first wall 511 and the second wall 512 extend separately away from the bottom wall 513. The slider elastic element 52 comprises a first elastic element end 521 and a second elastic element end 522. The first elastic element end 521 abuts the first wall 511. The second elastic element end 522 abuts the second wall 512. When the slider 51 is in the second slider position, the first elastic element end 521 and the second elastic element end 522 push the first wall 511, the second wall 512 and the bottom wall 513, and the slider 51 is therefore tend to return to the first slider position (FIG. 6A).

With reference to FIGS. 6A, 6B and 6C, in one embodiment, the slider 51 comprises a wedging portion 514 and a guiding rib 515. The slider 51 is connected to the module housing 1 via the wedging portion 514. The guiding rib 515 is adapted to abut the module housing 1 to guide the slider 51 to move straightly.

Figure 7A:
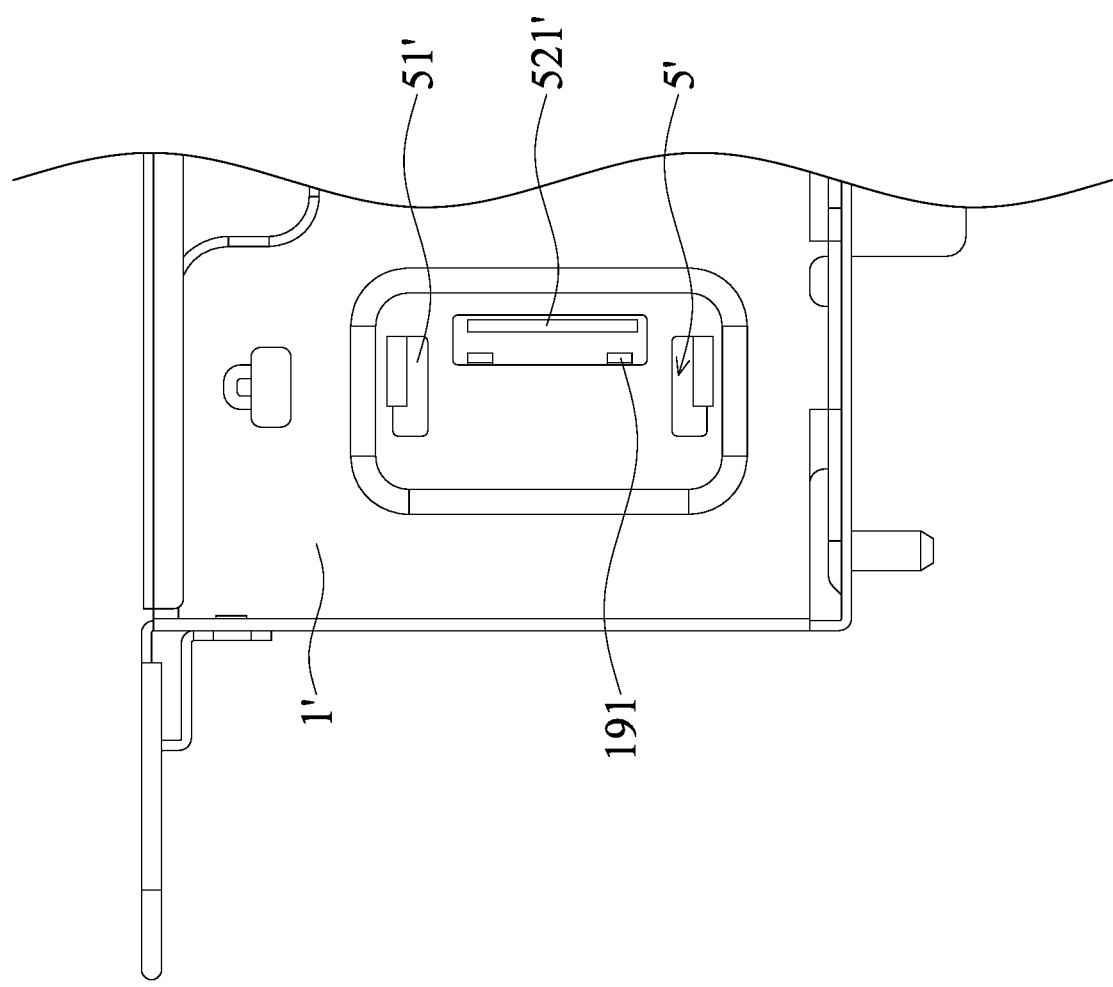
FIGS. 7A, 7B and 7C show a locking unit of another embodiment of the invention.
Figure 7B:
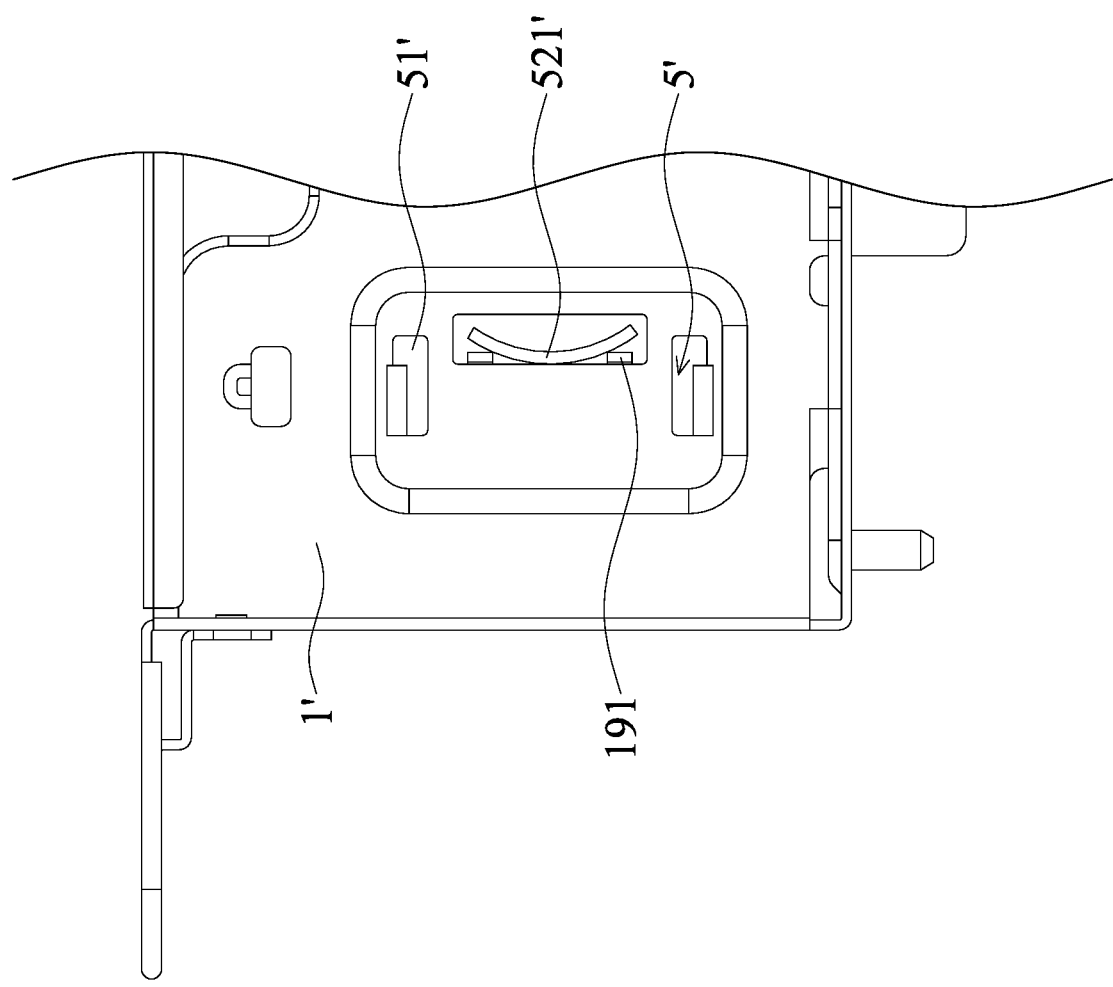
Figure 7C:
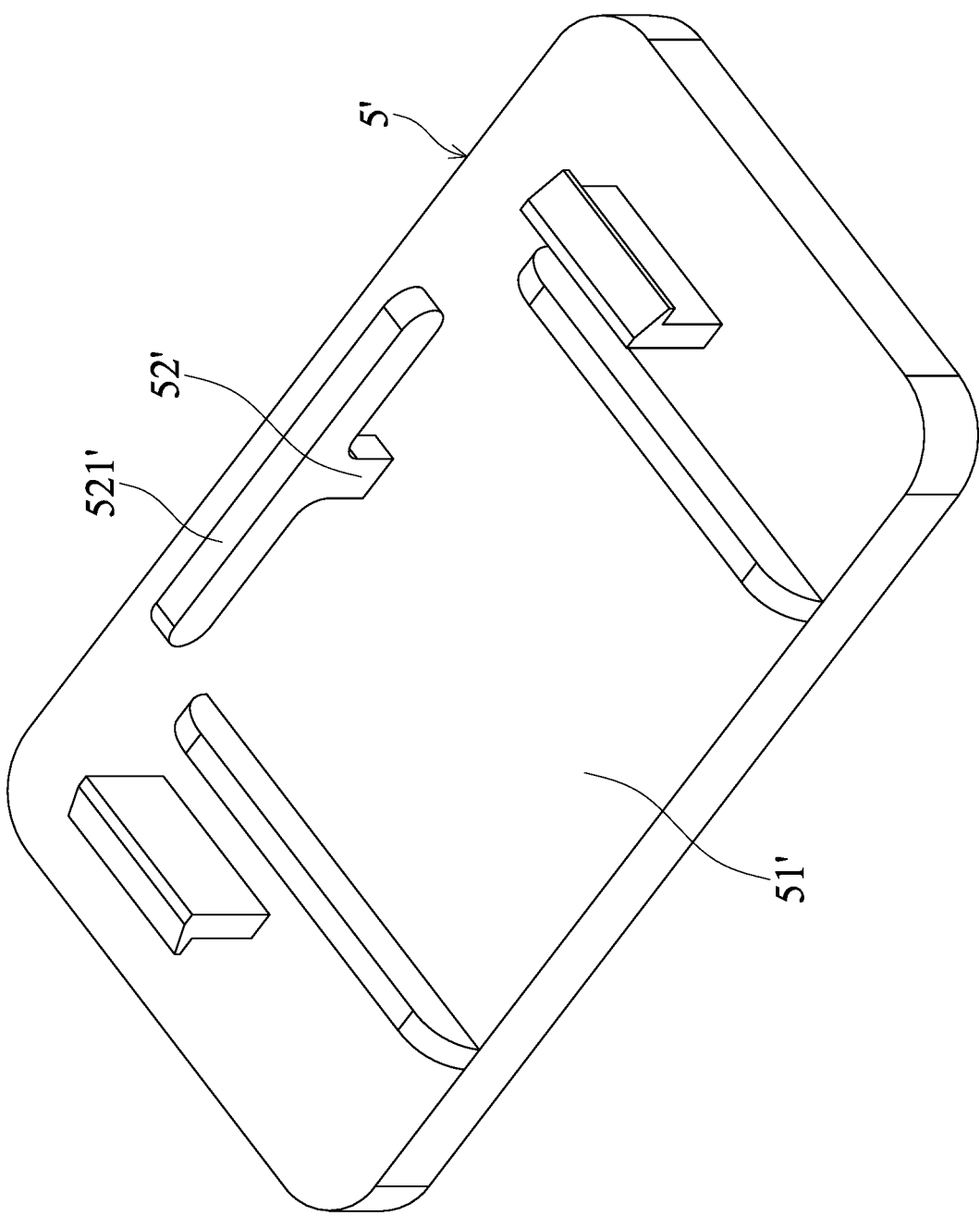

In the embodiments of the invention, the design of the locking unit can be modified. FIGS. 7A, 7B and 7C show a locking unit of another embodiment of the invention. With reference to FIGS. 7A, 7B and 7C, in this embodiment, the locking unit 5' includes a slider 51' and a slider elastic element 52'. The slider elastic element 52' is integrally formed on the slider 51'. The slider elastic element 52' comprises an elastic arm 521'. The module housing 1' comprises a housing protrusion 191. When the slider 51' is in the second slider position (FIG. 7B), the housing protrusion 191 pushes the elastic arm 521' and deforms the elastic arm 521', and the slider 51' is therefore tend to return to the first slider position (FIG. 7A).

Figure 8:
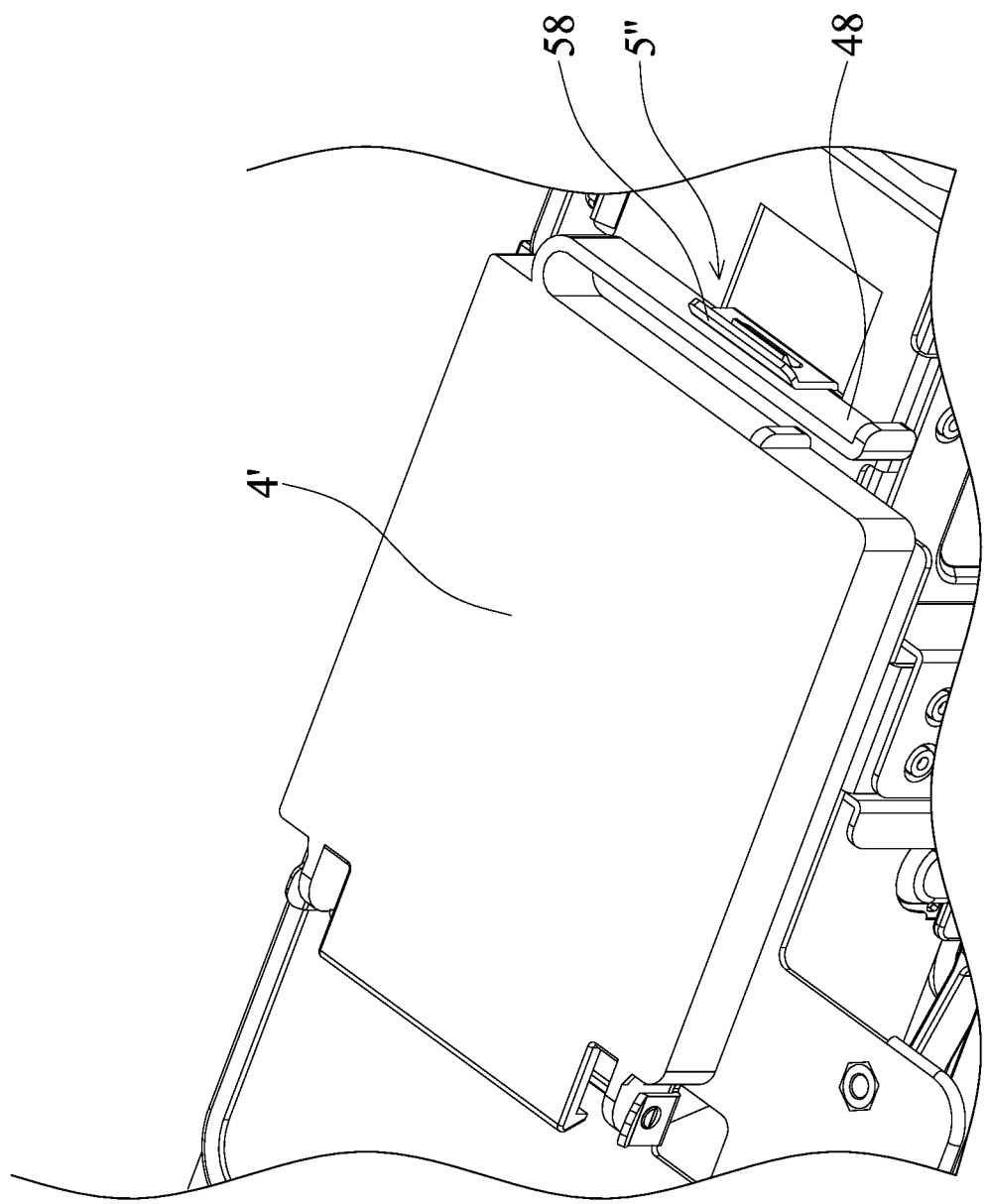
FIG. 8 shows a locking unit of another embodiment of the invention.

FIG. 8 shows a locking unit of another embodiment of the invention. With reference to FIG. 8, in this embodiment, the locking unit 5" comprises a wedging structure 58. The cover 4' comprises a cover elastic hook 48. When the cover 4' is in the first cover orientation, the cover elastic hook 48 wedges the wedging structure 58. When the cover 4' is in the second cover orientation, the cover elastic hook 48 is separated from the wedging structure 58. In this embodiment, the wedging structure 58 is integrally formed on the module housing.

Figure 9A:
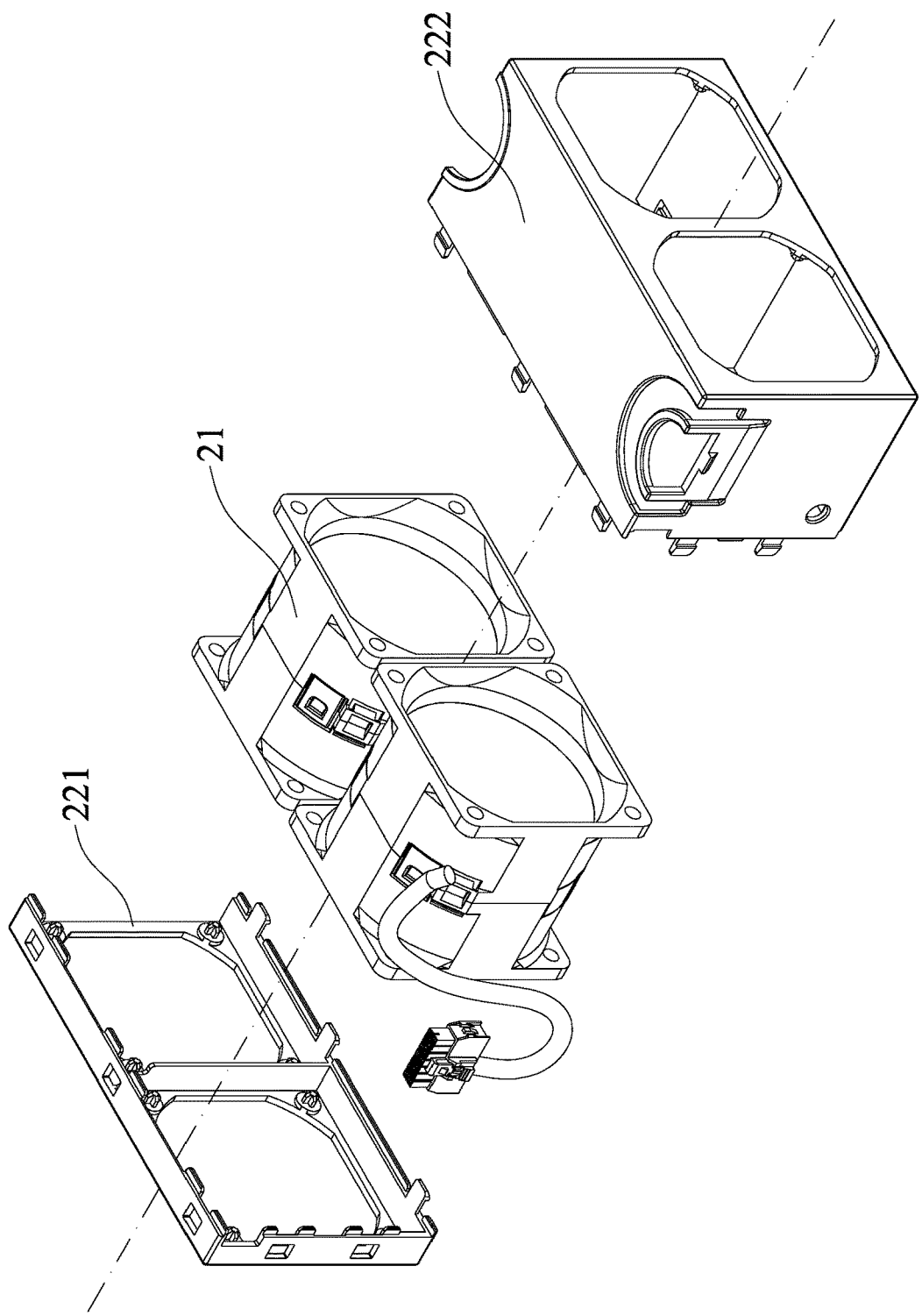
FIG. 9A is an exploded view of the fan unit of the embodiment of the invention.

FIG. 9A is an exploded view of the fan unit of the embodiment of the invention. With reference to FIGS. 2 and 9A, in one embodiment, the fan unit 2 comprises a fan 21, a first unit bracket 221 and a second unit bracket 222. The first unit bracket 221 is combined with the second unit bracket 222. The fan 21 is disposed between the first unit bracket 221 and the second unit bracket 222. The module housing 1 comprises a receiving recess 11, and the fan unit 2 is inserted into the receiving recess 11.

Figure 9B:
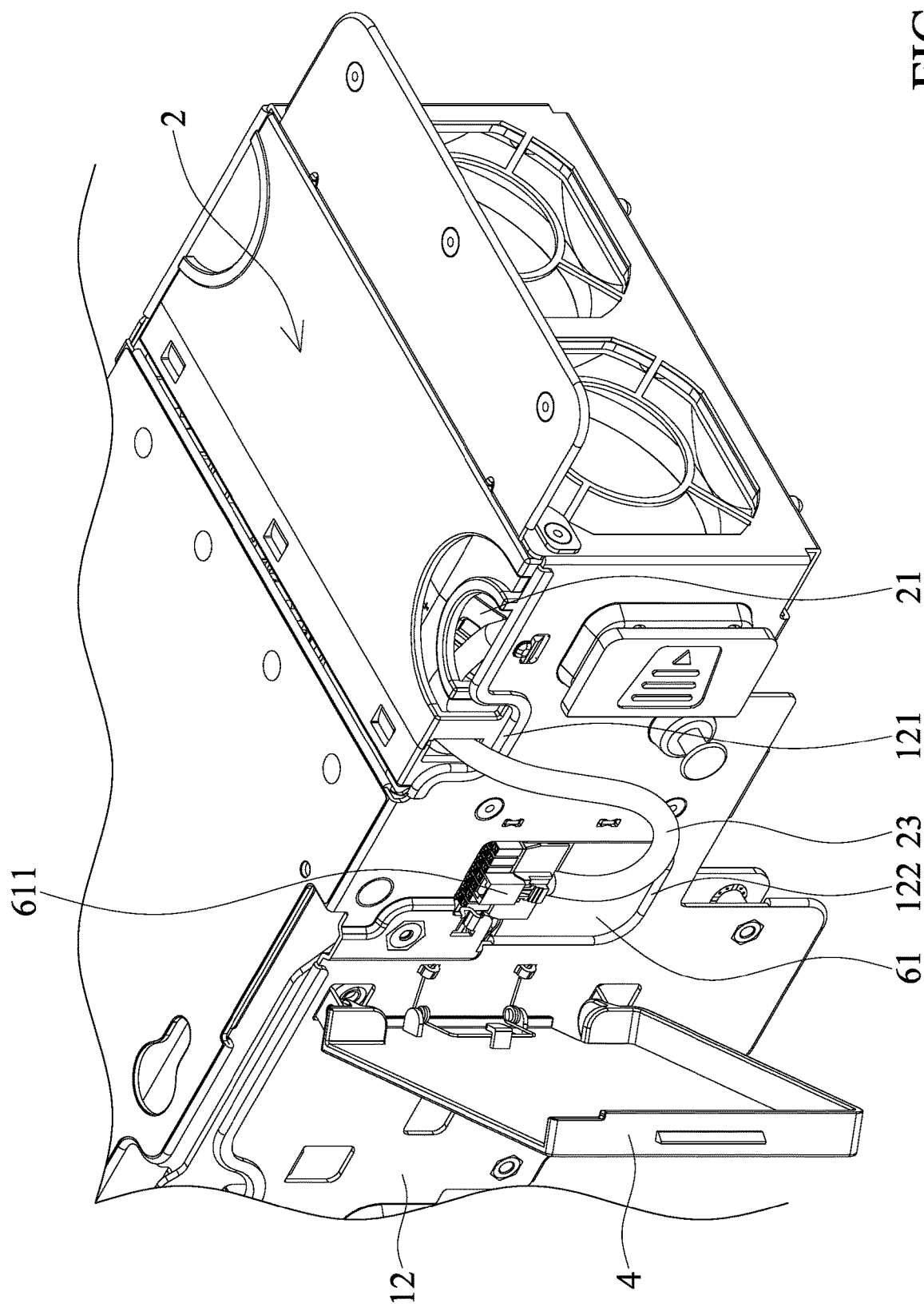
FIG. 9B shows the fan unit of the embodiment of the invention combined with the frame module.

FIG. 9B shows the fan unit of the embodiment of the invention combined with the frame module. With reference to FIG. 9B, in one embodiment, the frame module comprises a riser card 61. The riser card 61 is disposed in the module housing 1. The fan unit 2 comprises a connection line 23. One end of the connection line 23 is connected to the fan 21, and the other end of the connection line 23 is connected to the riser card 61. When the cover 4 is in the first cover orientation (with reference to FIG. 3A), the cover 4 covers at least a portion of the connection line 23.

With reference to FIG. 9B, in one embodiment, the module housing 1 comprises a housing wall 12. The riser card 61 is parallel to the housing wall 12. The cover 4 pivots on the housing wall 12. The housing wall 12 comprising a housing wall notch 121 and a housing wall opening 122. The connection line 23 passes through the housing wall notch 121 to connect to the fan 21. The connection line 23 passes through the housing opening 122 to connect to the riser card 61. With reference to FIGS. 3A and 9B, in one embodiment, when the cover 4 is in the first cover orientation, the cover 4 covers the housing wall opening 122. In this embodiment, the connection line 23 is connected to a riser card connector 611 of the riser card 61.

Utilizing the frame module of the embodiment of the invention, when the maintainer wants to detach the fan unit 2, the maintainer must open the cover 4 and remove the latch 3 from the fan unit 2, and the fan unit 2 therefore can be detached. After opening the cover 4, the maintainer will be aware of the connection line 23. The maintainer will thus disconnect the connection line 23 from the riser card 61 before detaching the fan unit 2. The riser card 61 can be prevented from being damaged, and the reliability and the lifespan of the electronic device can be increased.

In the embodiments above, the latch restricts and fastens the fan unit. However, the disclosure is not meant to restrict the invention. The latch can also be utilized to restrict and fasten other object unit.

Figure 10A:
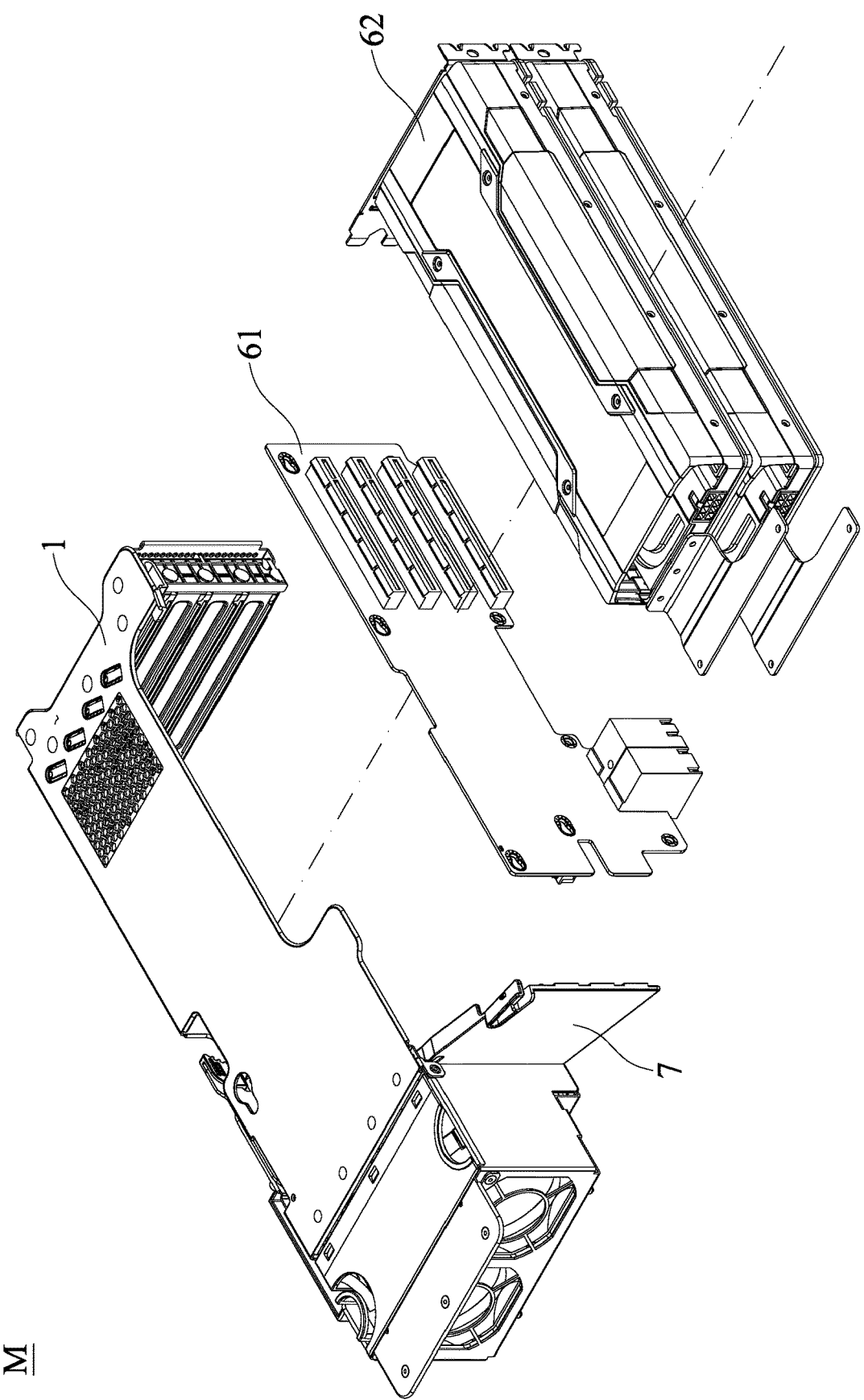
FIG. 10A shows the graphics processing interface cards and the riser card of the embodiment of the invention.
Figure 10B:
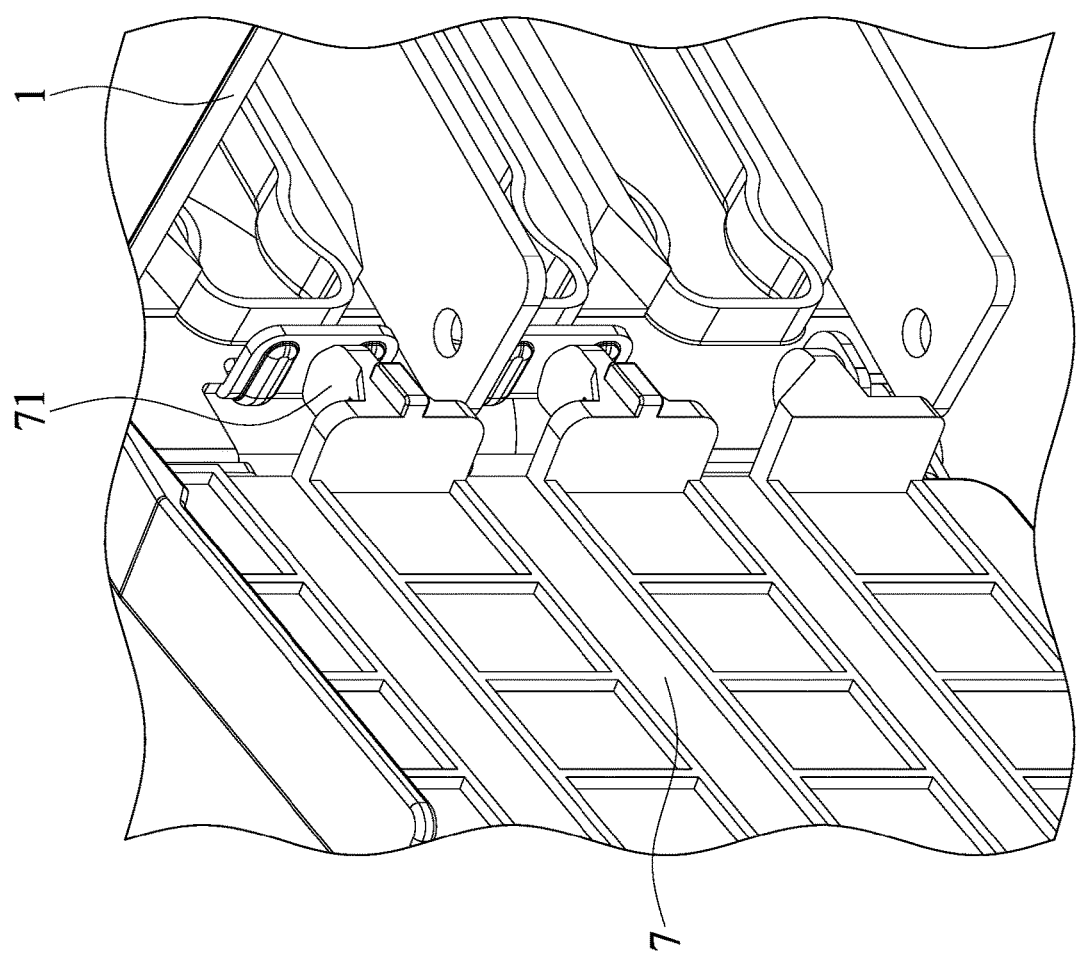
FIGS. 10B and 10C show the details of an interface card shield of the embodiment of the invention.
Figure 10C:
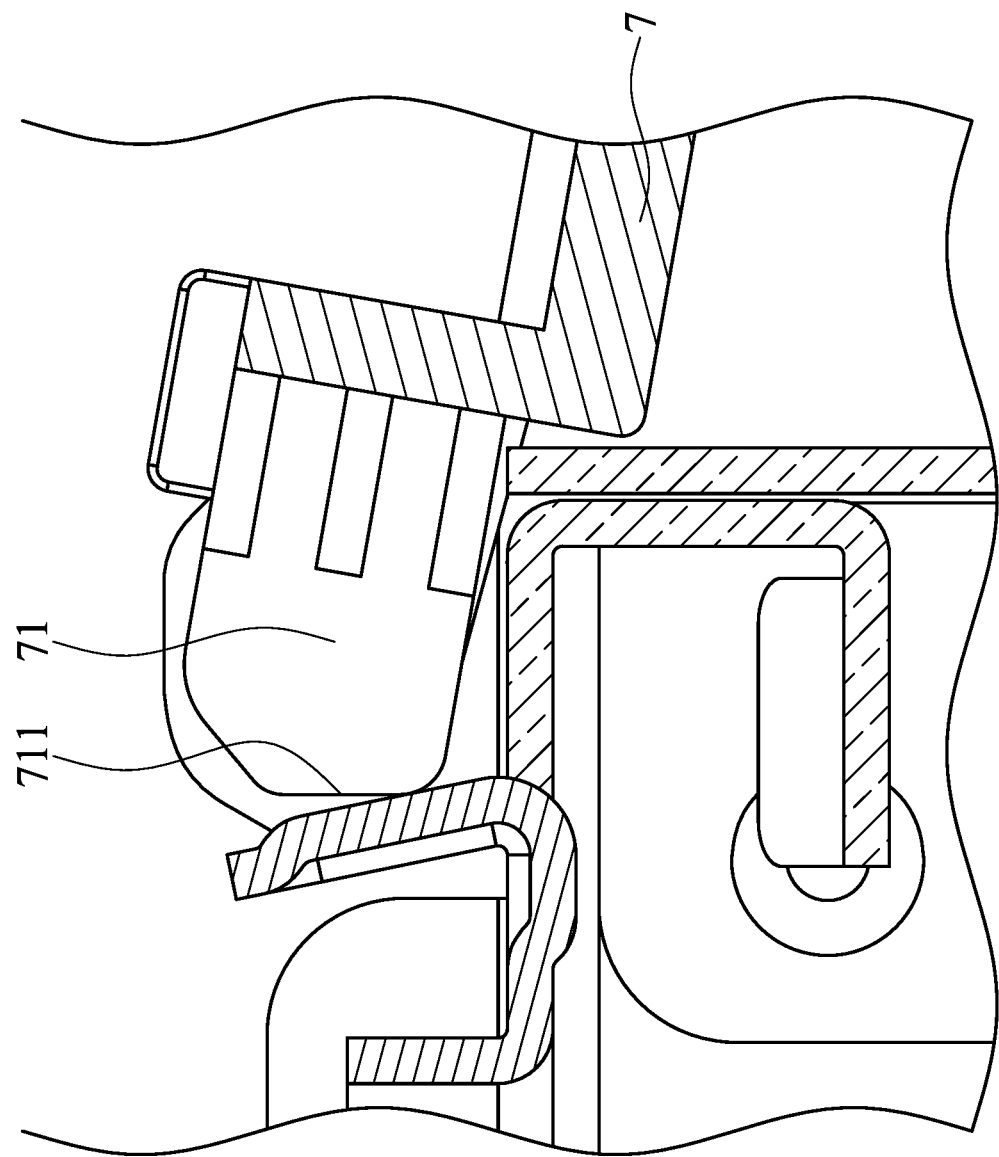

With reference to FIG. 10A, in one embodiment, the frame module M can be a graphics processing unit (GPU) which includes a plurality of graphics processing interface cards 62. The graphics processing interface cards 62 are coupled to the riser card 61. With reference to FIGS. 10A, 10B and 10C, in one embodiment, the frame module M further includes an interface card shield 7. The interface card shield 7 includes at least one shield rib 71. The shield rib 71 has a flat portion 711. When an included angle between the interface card shield 7 and the module housing 1 is 100 degrees, the flat portion 711 is adapted to abut the module housing 1 to keep the orientation of the interface card shield 7. The user can therefore access the graphics processing interface cards 62 easily.

In other embodiments, the frame module M can have other functions. The disclosure is not meant to restrict the invention.

The assembly process in the embodiment of the invention is described below. With reference to FIG. 10A, first, the riser card 61 is assembled into the module housing 1. Then, the graphics processing interface cards 62 are connected to the riser card 61. Next, the interface card shield 7 is closed. In another embodiment, the graphics processing interface cards 62 can be assembled later, and the interface card shield 7 can be closed later. There is no sequential relationship between the assembly of the graphics processing interface cards 62 and the fan unit 2. Then, with reference to FIG. 2, the fan unit 2 is connected to the receiving recess 11. Next, the connection line 23 is connected to the riser card connector 611 of the riser card 61. Then, with reference to FIGS. 3A and 3B, the cover 4 is closed, wherein the cover 4 is in the first cover orientation. The cover 4 covers at least a portion of the connection line 23. The cover 4 wedges the locking unit 5, and the cover 4 presses the latch 3 simultaneously. The latch 3 is in the first latch position. The latch 3 is connected to the fan unit 2 and restricts the fan unit 2. Finally, with reference to FIG. 1, the frame module M is inserted into the device housing H.

The detaching process of the embodiment of the invention is described below. First, with reference to FIG. 1, the frame module M is removed from the device housing H. Next, with reference to FIGS. 3A and 4A, the locking unit 5 is pushed as arrow labeled to be separated from the cover 4. Next, with reference to FIGS. 4A, 4B and 5A, the second elastic force of the cover elastic element 49 moves the cover 4 from the first cover orientation to the second cover orientation, and at the same time, the cover 4 stops pressing the latch 3. The first elastic force of the latch elastic element 39 moves the latch 3 from the first latch position to the second latch position, and the latch 3 is separated from the fan 2. Finally, with reference to FIG. 2, the fan unit 2 is removed from the receiving recess 11.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frame module, adapted to connect to an object unit, comprising:
    a module housing, wherein the object unit is connected to the module housing;
    a latch, connected to the module housing, wherein the latch is adapted to be moved between a first latch position and a second latch position, when the latch is in the first latch position, the latch is connected to the object unit to restrict the object unit, and when the latch is in the second latch position, the latch is separated from the object unit; and a cover, pivoting on the module housing, wherein the cover is adapted to be rotated between a first cover orientation and a second cover orientation, and when the cover is in the first cover orientation, the cover presses the latch and keeps the latch in the first latch position, and when the cover leaves the first cover orientation, the latch is separated from the cover and is not pressed by the cover, and the latch is returned to the second latch position.

2. The frame module as claimed in claim 1, further comprising a locking unit, wherein the locking unit is disposed on the module housing, and when the cover is in the first cover orientation, the cover is wedged into the locking unit, and when the cover is in the second cover orientation, the cover is separated from the locking unit.

3. The frame module as claimed in claim 2, further comprising a latch elastic element, wherein one end of the latch elastic element abuts the latch, the other end of the latch elastic element abuts the module housing, and when the latch is in the first latch position, the latch elastic element provides a first elastic force on the latch, and the latch is tend to be moved toward the second latch position.

4. The frame module as claimed in claim 3, further comprising a cover elastic element, wherein the cover elastic element abuts the cover and the module housing, and when the cover is in the first cover orientation, the cover elastic element exerts a second elastic force on the cover, and the cover is tend to be moved toward the second cover orientation.

5. The frame module as claimed in claim 3, wherein the locking unit comprises a slider and a slider elastic element, the slider is slidably connected to the module housing, the slider elastic element is disposed between the slider and the module housing, the slider is adapted to be moved between a first slider position and a second slider position, and when the slider is in the first slider position, the slider is adapted to be wedged into the cover, and when the slider is in the second slider position, the slider is tend to release the cover.

6. The frame module as claimed in claim 5, wherein the slider comprises a groove, the groove comprises a first wall, a second wall, and a bottom wall, the first wall and the second wall are connected to the bottom wall, the first wall and the second wall extend separately away from the bottom wall, the slider elastic element comprises a first elastic element end and a second elastic element end, the first elastic element end abuts the first wall, the second elastic element end abuts the second wall, and when the slider is in the second slider position, the first elastic element end and the second elastic element end push the bottom wall and the slider is tend to turn to the first slider position.

7. The frame module as claimed in claim 5, wherein the slider elastic element comprises an elastic arm, the module housing comprises a housing protrusion, and when the slider is in the second slider position, the housing protrusion pushes the elastic arm and deforms the elastic arm, and the slider is tend to turn to the first slider position.

8. The frame module as claimed in claim 3, wherein the locking unit comprises a wedging structure, the cover comprises a cover elastic hook, and when the cover is in the first cover orientation, the cover elastic hook wedges the wedging structure.

9. An electronic device, comprising:
a device housing;
an object unit; and
a frame module, disposed in the device housing, comprising:

a module housing, wherein the object unit is connected to the module housing;
a latch, connected to the module housing, wherein the latch is adapted to be moved between a first latch position and a second latch position, when the latch is in the first latch position, the latch is connected to the object unit to restrict the object unit, and when the latch is in the second latch position, the latch is separated from the object unit; and
a cover, pivoting on the module housing, wherein the cover is adapted to be rotated between a first cover orientation and a second cover orientation, the cover presses the latch to keep the latch in the first latch position, and when the cover is in the first cover orientation, the cover presses the latch and keeps the latch in the first latch position, and when the cover leaves the first cover orientation, the latch is separated from the cover and is not pressed by the cover, and the latch is returned to the second latch position.

10. The electronic device as claimed in claim 9, wherein the frame module further comprises a locking unit, the locking unit is disposed on the module housing, and when the cover is in the first cover orientation, the cover is wedged into the locking unit, and when the cover is in the second cover orientation, the cover is separated from the locking unit.

11. The electronic device as claimed in claim 10, wherein the frame module further comprises a latch elastic element, one end of the latch elastic element abuts the latch, the other end of the latch elastic element abuts the module housing, and when the latch is in the first latch position, the latch elastic element exerts a first elastic force on the latch, and the latch is tend to be moved toward the second latch position.

12. The electronic device as claimed in claim 11, wherein the frame module further comprises a cover elastic element, the cover elastic element abuts the cover and the module housing, when the cover is in the first cover orientation, the cover elastic element exerts a second elastic force on the cover, and the cover is tend to be moved toward the second cover orientation.

13. The electronic device as claimed in claim 11, wherein the locking unit comprises a slider and a slider elastic element, the slider is slidably connected to the module housing, the slider elastic element is disposed between the slider and the module housing, the slider is adapted to be moved between the first slider position and the second slider position, and when the slider is in the first slider position, the slider is adapted to be wedged into the cover, and when the slider is in the second slider position, the slider is tend to release the cover.

14. The electronic device as claimed in claim 13, wherein the slider comprises a groove, the groove comprises a first wall, a second wall, and a bottom wall, the first wall and the second wall are connected to the bottom wall, the first wall and the second wall extend separately away from the bottom wall, the slider elastic element comprises a first elastic element end and a second elastic element end, the first elastic element end abuts the first wall, the second elastic element end abuts the second wall, and when the slider is in the second slider position, the first elastic element end and the second elastic element end push the bottom wall and the slider is tend to turn to the first slider position.

15. The electronic device as claimed in claim 13, wherein the slider elastic element comprises an elastic arm, the module housing comprises a housing protrusion, and when the slider is in the second slider position, the housing protrusion pushes the elastic arm and deforms the elastic arm, and the slider is tend to turn to the first slider position.

16. The electronic device as claimed in claim 11, wherein the locking unit comprises a wedging structure, the cover comprises a cover elastic hook, and when the cover is in the first cover orientation, the cover elastic hook wedges the wedging structure.

17. The electronic device as claimed in claim 9, wherein the object unit comprises a fan, a first unit bracket and a second unit bracket, the first unit bracket is combined with the second unit bracket, the fan is disposed between the first unit bracket and the second unit bracket, the module housing comprises a receiving recess, and the object unit is inserted into the receiving recess.

18. The electronic device as claimed in claim 17, wherein the frame module comprises a riser card, the riser card is disposed in the module housing, the object unit comprises a connection line, one end of the connection line is connected to the fan, the other end of the connection line is connected to the riser card, and when the cover is in the first cover orientation, the cover covers at least a portion of the connection line.

19. The electronic device as claimed in claim 18, wherein the module housing comprises a housing wall, the riser card is parallel to the housing wall, the cover pivots on the housing wall, the housing wall comprises a housing wall notch and a housing wall opening, the connection line passes through the housing wall notch to connect to the fan, and the connection line passes through the housing opening to connect to the riser card.

20. The electronic device as claimed in claim 19, wherein when the cover is in the first cover orientation, the cover covers the housing wall opening.

* * * * *